United States Patent
Hachiya et al.

(10) Patent No.: US 11,488,849 B2
(45) Date of Patent: Nov. 1, 2022

(54) SUBSTRATE PROCESSING APPARATUS WITH RESISTANCE VALUE VARYING MECHANISM

(71) Applicant: Tokyo Electron Limited, Tokyo (JP)

(72) Inventors: Yosuke Hachiya, Koshi (JP); Yusuke Hashimoto, Koshi (JP); Tadashi Iino, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 26 days.

(21) Appl. No.: 16/716,738

(22) Filed: Dec. 17, 2019

(65) Prior Publication Data

US 2020/0203189 A1 Jun. 25, 2020

(30) Foreign Application Priority Data

Dec. 25, 2018 (JP) .............................. JP2018-240760

(51) Int. Cl.
| | | |
|---|---|---|
| H01L 21/673 | (2006.01) | |
| H01L 21/67 | (2006.01) | |
| H01L 21/302 | (2006.01) | |
| H01L 21/02 | (2006.01) | |
| H01L 21/687 | (2006.01) | |

(52) U.S. Cl.
CPC ...... *H01L 21/673* (2013.01); *H01L 21/02057* (2013.01); *H01L 21/302* (2013.01); *H01L 21/67063* (2013.01); *H01L 21/67248* (2013.01); *H01L 21/68764* (2013.01)

(58) Field of Classification Search
CPC ............ H01L 21/673; H01L 21/67063; H01L 21/02057; H01L 21/68764; H01L 21/302; H01L 21/67248; H01L 21/68728; H01L 21/68785; H01L 21/67075; H01L 21/30604; H01L 21/6704; H01L 21/67; H01L 21/67023; H01L 21/67017
See application file for complete search history.

(56) References Cited

U.S. PATENT DOCUMENTS

| | | | | |
|---|---|---|---|---|
| 2007/0153244 A1* | 7/2007 | Maria Zaal | ......... | G03F 7/70875 355/30 |
| 2008/0006302 A1* | 1/2008 | Araki | ................ | H01L 21/67051 134/26 |
| 2013/0084710 A1* | 4/2013 | Miyagi | ............. | H01L 21/67023 438/745 |

FOREIGN PATENT DOCUMENTS

| | | |
|---|---|---|
| JP | 2012-004320 A | 1/2012 |
| JP | 2017-183389 A | 10/2017 |

* cited by examiner

*Primary Examiner* — Thanhha S Pham
(74) *Attorney, Agent, or Firm* — Pearne & Gordon LLP (57) ABSTRACT

A substrate processing apparatus comprises a holder configured to hold a substrate; a processing liquid supply configured to supply a processing liquid onto the substrate held by the holder; and a resistance value varying mechanism configured to vary an electrical resistance of the holder in contact with the substrate.

13 Claims, 6 Drawing Sheets

SUBSTRATE PROCESSING APPARATUS WITH RESISTANCE VALUE VARYING MECHANISM

CROSS-REFERENCE TO RELATED APPLICATION

This application claims the benefit of Japanese Patent Application No. 2018-240760 filed on Dec. 25, 2018, the entire disclosure of which is incorporated herein by reference.

TECHNICAL FIELD

The various aspects and embodiments described herein pertain generally to a substrate processing apparatus and a substrate processing method.

BACKGROUND

Patent Document 1 describes a configuration in which a peripheral portion of a substrate is held by a movable member when a liquid processing such as etching is performed by supplying a processing liquid onto the substrate being rotated.

Patent Document 1: Japanese Patent Laid-open Publication No. 2012-004320

SUMMARY

In one exemplary embodiment, a substrate processing apparatus comprises a holder configured to hold a substrate; a processing liquid supply configured to supply a processing liquid onto the substrate held by the holder; and a resistance value varying mechanism configured to vary an electrical resistance of the holder in contact with the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the various drawings, same or corresponding parts will be assigned same reference numerals.

[Configuration of Substrate Processing System]

Figure 1:
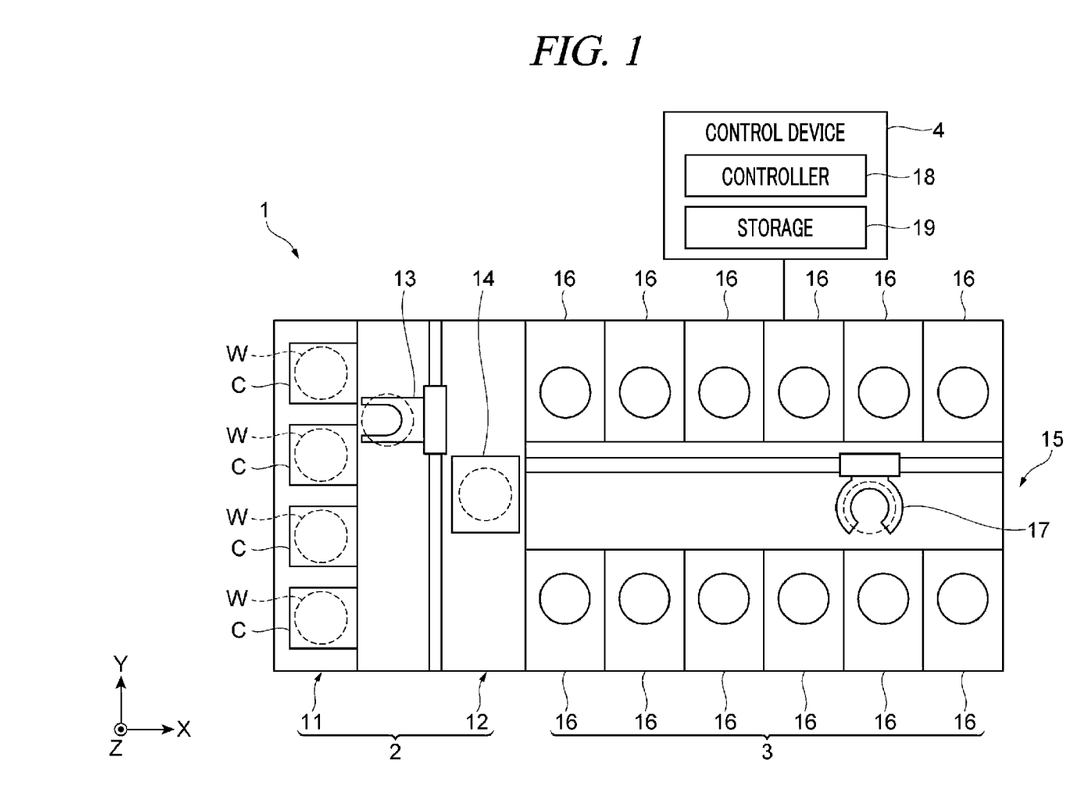
FIG. 1 is a diagram illustrating a substrate processing system according to an exemplary embodiment.

FIG. 1 is a plan view illustrating an outline of the substrate processing system according to the exemplary embodiment. In the following, in order to clarify positional relationships, the X-axis, the Y-axis and the Z-axis which are orthogonal to each other will be defined. The positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, carriers C each accommodating semiconductor wafers W (hereinafter, referred to as "wafers W") horizontally are placed.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafer W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing unit 16 by using the wafer holding mechanism.

The processing units 16 perform a predetermined substrate processing on the wafer W transferred by the substrate transfer device 17 under the control of a controller 18 to be described later.

Further, the substrate processing system 1 is equipped with a control device 4. The control device 4 is, for example, a computer, and includes a controller 18 and a storage 19. The storage 19 stores therein a program that controls various processings performed in the substrate processing system 1. The controller 18 controls the operation of the substrate processing system 1 by reading and executing the program stored in the storage 19.

Further, the program may be recorded in a computer-readable recording medium and may be installed to the storage 19 of the control device 4 from this recording medium. The computer-readable recording medium may be, by way of non-limiting example, a hard disk (HD), a flexible disk (FD), a compact disk (CD), a magnet optical disk (MO), a memory card, or the like.

In the substrate processing system 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, and then taken out from the processing unit 16 and placed on the delivery unit 14 by the substrate transfer device 17. After the processing of placing the wafer W on the delivery unit 14, the wafer W returns back into the carrier C of the carrier placing section 11 by the substrate transfer device 13.

[Configuration of Substrate Processing Apparatus]

Figure 2:
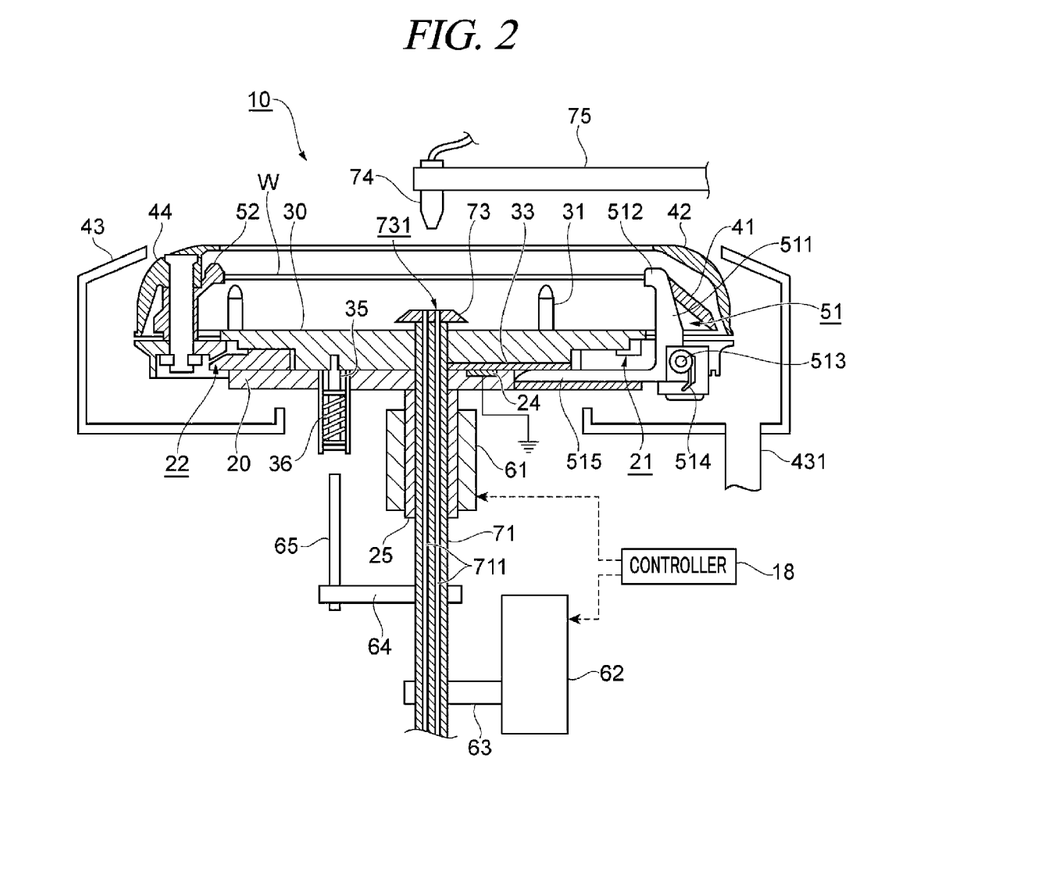
FIG. 2 is a diagram illustrating a substrate processing apparatus according to the exemplary embodiment.
Figure 3:
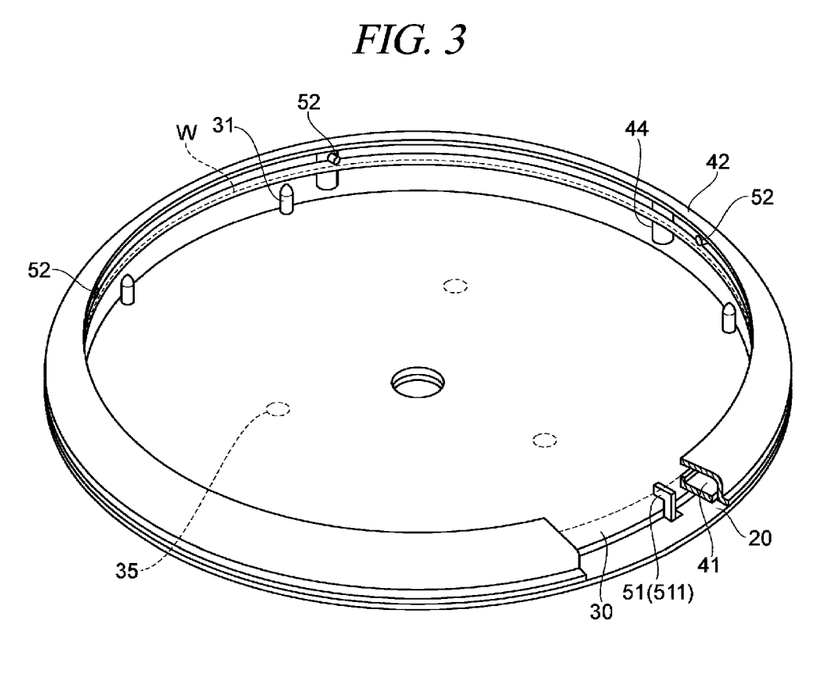
FIG. 3 is a diagram illustrating a vicinity of a rotary plate and a supporting plate in the substrate processing apparatus according to the exemplary embodiment.

Now, a configuration of a substrate processing apparatus 10 included in the substrate processing system 1 will be explained with reference to FIG. 2 and FIG. 3. The substrate processing apparatus 10 belongs to the processing unit 16 of the substrate processing system 1. FIG. 2 is a longitudinal cross sectional view of the substrate processing apparatus 10, and FIG. 3 is an exploded perspective view illustrating a configuration of a rotary plate and a supporting plate belonging to the substrate processing apparatus 10.

The substrate processing apparatus 10 is equipped with, as depicted in a longitudinal side view of FIG. 2, a rotary plate 20, a supporting plate 30, a movable member 51 and a restriction member 52. The rotary plate 20 is provided on top of a rotation shaft 25 configured as a vertical shaft, and is configured to be rotatable. The supporting plate 30 is configured to support a wafer W (substrate) with protrusions 31 provided on a top surface thereof. The supporting plate 30 is placed on the rotary plate 20, and is rotated along with the rotary plate 20 as one body. The restriction member 52 confines a side peripheral surface of the wafer W. The movable member 51 holds the wafer W by pressing the wafer W toward the restriction member 52. In this substrate processing apparatus 10, the supporting plate 30 corresponds to an upper rotary plate of the present exemplary embodiment, and the rotary plate 20 corresponds to a lower rotary plate of the present exemplary embodiment. Further, in the following exemplary embodiment, the movable member 51 serves as a holder configured to hold the wafer W.

The rotary plate 20 is a circular plate having a diameter larger than that of the wafer W. The rotary plate 20 is provided with, in a top surface thereof, a drain opening 21 through which a cleaning liquid (processing liquid) flown into a gap between the rotary plate 20 and the supporting plate 30 is collected to be discharged out through a discharge hole 22. The drain opening 21 is formed along a circumferential direction of the rotary plate 20. The discharge hole 22 extends downwards from an outer side of the drain opening 21 toward an outside of the rotary plate 20 in a diametrical direction thereof, and an end of the discharge hole 22 is opened at an outer peripheral surface of the rotary plate 20. With this configuration, the cleaning liquid collected in the drain opening 21 can be discharged out through the discharge hole 22 by using a centrifugal force.

The vertically extending rotation shaft 25 having a cylindrical shape is connected to a central portion of a bottom surface of the rotary plate 20. The rotation shaft 25 is inserted in a rotation motor 61 as a rotation driving unit configured to rotate the rotation shaft 25. By rotating the rotation shaft 25 with this rotation motor 61, the rotary plate 20 can be rotated on the rotation shaft 25 in a substantially horizontal state. The rotation motor 61 is controlled by the controller 18.

The supporting plate 30 is a circular plate having the substantially same size as the wafer W. The supporting plate 30 is provided with, on a bottom surface thereof, a protrusion (not shown) configured to be fitted into a recess (not shown) provided at the rotary plate 20. If the supporting plate 30 is placed on the rotary plate 20, the recess and the protrusion are engaged with each other, so that the top surface of the rotary plate 20 and the bottom surface of the supporting plate 30 are in contact with each other.

The protrusions 31 are provided on the top surface of the supporting plate 30 along an outer periphery portion thereof. By placing the wafer W on these protrusions 31, the wafer W can be supported at a position lifted up from the supporting plate 30.

Further, a cleaning liquid supply line 71 is inserted in the aforementioned rotation shaft 25, which is connected to the bottom surface of the rotary plate 20, to penetrate the cylindrical rotation shaft 25 in a vertical direction. The cleaning liquid supply line 71 extends upwards through the rotary plate 20 and the supporting plate 30 such that an upper end thereof reaches the top surface of the supporting plate 30. A plurality of (e.g., four) cleaning liquid supply paths 711 is formed within the cleaning liquid supply line 71 along the direction in which the cleaning liquid supply line 71 extends. Through these cleaning liquid supply paths 711, various kinds of chemical liquids as a cleaning liquid or a rinse liquid can be supplied. A gas supply path through which a gas such as a $N_2$ gas passes may be provided as the cleaning liquid supply line 71.

A bottom-surface nozzle 73 having a small disk shape is provided at the upper end of the cleaning liquid supply line 71. The cleaning liquid can be discharged from a discharge hole 731, which is provided at a leading end of the bottom-surface nozzle 73, toward a rear surface of the wafer W held at the position lifted from the supporting plate 30. The cleaning liquid supply line 71 and the bottom-surface nozzle 73 are provided independently from the rotary plate 20, the rotation shaft 25 and the supporting plate 30. Even when the rotary plate 20 and the supporting plate 30 are being rotated, the cleaning liquid supply line 71 and the bottom-surface nozzle 73 can supply the cleaning liquid in a stopped state. The cleaning liquid supply line 71 and the bottom-surface nozzle 73 correspond to a processing liquid supply of the present exemplary embodiment.

Connection shafts 35 (see FIG. 2) as protruding members are connected to three positions of the bottom surface of the supporting plate 30, as indicated by dashed lines in FIG. 3.

Each connection shaft 35 is inserted into a sheath portion forming a through hole provided in the bottom surface of the rotary plate 20 and fixed to the bottom surface of the supporting plate 30. Further, each connection shaft 35 is connected to a compression spring 36.

In a normal state, since a restoring force of the compression spring 36 is applied in a direction in which the compression spring 36 extends, the supporting plate 30 is drawn downwards and moved to a position shown in FIG. 2 to be placed on the rotary plate 20. Meanwhile, if the connection shaft 35 is lifted up, the compression spring 36 is compressed, so that the supporting plate 30 can be lifted up from the rotary plate 20. If the supporting plate 30 is lifted up from the rotary plate 20, leading ends of the protrusions 31 protrude up to a height position higher than a middle cup 42 to be described later. Thus, the wafer W can be transferred to/from an external transfer arm without interfering with other components.

Furthermore, three lifting members 65 each configured to move the supporting plate 30 up by pushing up a lower end of the corresponding connection shaft 35 are fixed to the cleaning liquid supply line 71 with an elevating member 64 therebetween. Further, the cleaning liquid supply line 71 is connected to a connection member 63 which is configured to be movable up and down by an elevating motor 62. The elevating motor 62 is controlled by the controller 18. By moving up the connection member 63 by the elevating motor 62, the lifting members 65 are raised, and as the connection shafts 35 are lifted up by the raised lifting members 65, the supporting plate 30 can be moved up to the position lifted from the rotary plate 20. If the lifting members 65 are lowered down below the lower end of the connection shafts 35, on the other hand, the supporting plate 30 is moved down to be placed on the rotary plate 20. In this point of view, the elevating motor 62, the connection member 63, the cleaning liquid supply line 71, the elevating member 64 and the lifting members 65 serve as an elevating mechanism for the supporting plate 30.

Furthermore, a top-surface nozzle 74 configured to supply the processing liquid such as the cleaning liquid is provided near a top surface of the wafer W. The top-surface nozzle 74 is connected to a leading end of an arm 75. By moving the arm 75, the top-surface nozzle 74 can be moved between a supply position above a central portion of the wafer W to which the cleaning liquid is to be supplied and a retreat position retreated from above the wafer W.

The middle cup 42 is provided along a periphery of the rotary plate 20. The middle cup 42 has a function of receiving the cleaning liquid scattered from the wafer W. The middle cup 42 has a dome shape with an arc-shaped longitudinal cross section, and is provided with, in a top surface thereof, an opening for allowing the wafer W, which is moved up and down while being supported by the supporting plate 30, to pass therethrough. Further, a lower peripheral end of the middle cup 42 is in a state where it is lifted up from the top surface of the rotary plate 20. Therefore, the cleaning liquid supplied to the wafer W is discharged to an outside of the middle cup 42 from a gap between the lower peripheral end of the middle cup 42 and the top surface of the rotary plate 20.

Provided within the middle cup 42 is a ring-shaped inner cup 41. This inner cup 41 is disposed along an edge of the wafer W held by the supporting plate 30. The middle cup 42 and the inner cup 41 are fastened to the rotary plate 20 by a bolt 44. Accordingly, if the rotary plate 20 is rotated, the middle cup 42 and the inner cup 41 are also rotated, the same as the supporting plate 30.

An outer cup 43 configured to cover the rotary plate 20 and the inner cup 41 from the outside thereof is disposed at a region outside the middle cup 42. The cleaning liquid discharged from the gap between the middle cup 42 and the rotary plate 20 is received by the outer cup 43 to be drained out to the outside through a liquid drain line 431.

The substrate processing apparatus 10 is equipped with the restriction member 52 configured to confine the side peripheral surface of the wafer W to hold the wafer W which is rotated above the rotary plate 20 and the supporting plate 30; and the movable member 51 (holder) configured to press the wafer W toward the restriction member 52.

The movable member 51 is a substantially L-shaped member, and has a pressing target portion 515 as a lower end portion extending in a direction from a periphery of the wafer W toward a center thereof; and an upright portion 511 as an upper end portion continuously extending upwards from an end of the pressing target portion 515.

When the supporting plate 30 is placed on the rotary plate 20, the upright portion 511 provided at the movable member 51 approaches the wafer W from a side thereof and presses the side peripheral surface of the wafer W toward the restriction member 52. The substrate processing apparatus 10 is equipped with one or more movable members 51. The present exemplary embodiment will be described for an example where three movable members 51 are provided. In FIG. 2, one of the three movable members 51 is illustrated.

A groove may be formed at a leading end 512 of the upright portion 511 to face the side peripheral surface of the wafer W. If the groove is provided, an edge portion of the wafer W is fitted into this groove, so that the side peripheral surface of the wafer W can be pressed against and held by the restriction member 52. Further, a groove may be formed at a leading end of the upright portion 511, as long as the wafer W is held with the movable member 51 and the restriction member 52 by pressing the side peripheral surface of the wafer W against the restriction member 52.

The pressing target portion 515 of the movable member 51 is typically fitted in a groove (not shown) formed at the rotary plate 20. Further, in the state that the supporting plate 30 is lifted up from the rotary plate 20, a force is applied to the pressing target portion 515 in a direction that makes the pressing target portion 515 is protruded upward from the groove. To realize this function of the pressing target portion 515, the movable member 51 is rotatably supported around a horizontal rotation shaft 513 so that an end portion of the pressing target portion 515 near a central portion of the rotary plate 20 is protruded upward.

A side surface of the movable member 51 is connected to a spring member 514 of a torsion spring shape wound around the rotation shaft 513. A force is applied to the spring member 514 in a direction that makes the upright portion 511 is pushed down toward the outside of the rotary plate 20 in the diametrical direction. As a result, the end portion of the pressing target portion 515 is protruded upward from the groove formed at the rotary plate 20.

Figure 4:
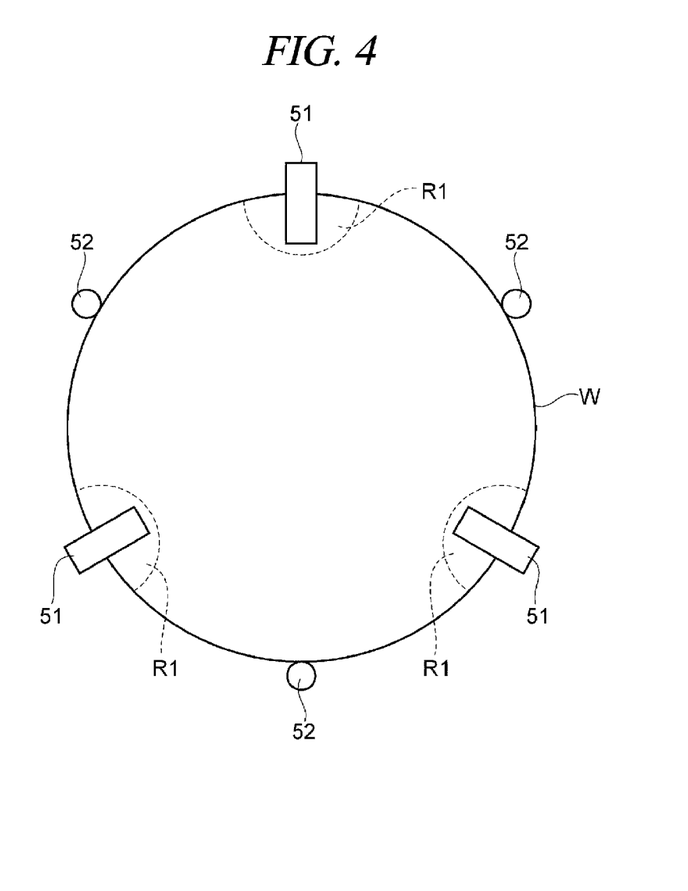
FIG. 4 is a diagram illustrating arrangement of movable members in the substrate processing apparatus according to the exemplary embodiment.

The restriction member 52 is fixed at a predetermined position (where it faces the movable member 51 with the wafer W therebetween). When the supporting plate 30 is placed on the rotary plate 20, the restriction member 52 confines the side peripheral surface of the wafer W and serves to hold the wafer W in cooperation with the movable member 51. A plurality of restriction members 52 is provided at preset positions along a circumferential direction of the supporting plate 30. Each restriction member 52 may be provided at a position facing the corresponding movable member 51, or a set of multiple restriction members 52 and one movable member 51 are disposed to face each other and holds the wafer W. As an example, in FIG. 4, three movable members 51 are arranged at a regular angular interval of 120°, and three restriction members 52 are provided at positions respectively facing these movable members 51 with respect to the center of the wafer W. In this configuration, the three movable members 51 and the three restriction members 52 are alternately arranged at a regular angular interval of 60°.

With regard to the above-described movable member 51, if the supporting plate 30 is lowered to be placed on the rotary plate 20, the pressing target portion 515 of the movable member 51 is pressed against the supporting plate 30. Accordingly, the movable member 51 is rotated around the rotation shaft, so that the upright portion 511 is moved toward the central portion of the rotary plate 20 and presses the wafer W held by the supporting plate 30 from the side peripheral surface thereof. The upright portion 511 extends upward from a gap between the groove of the rotary plate 20 and the supporting plate 30, and confines and holds the wafer W. In this way, the supporting plate 30 serves as a member pressing the pressing target portion 515 of the movable member 51 and has a function as a movable member operating mechanism.

The above-described movement of the movable member 51 using the rotation shaft 513 is nothing more than an example. The way how to move the movable member 51 in relation to the movement of the wafer W is not limited to the aforementioned example. That is, the movable member 51 may not use the rotation shaft 513. By way of example, a state where the wafer W is held by using the movable member 51 and the restriction member 52 and a state where the wafer W is not held by them may be switched by moving the movable member 51 along the diametrical direction of the wafer W.

In the above-described substrate processing apparatus 10, the processing liquid or the like is supplied onto the wafer W in the state that the wafer W is held by the movable member 51 and the restriction member 52, so that a processing upon the wafer W is performed. Conventionally, a conductive member such as PFA (Perfluoroalkoxyalkane) or PEEK (Poly Ether Ether Ketone) to which carbon black is added may be used as the movable member 51. When the supporting plate 30 is placed on the rotary plate 20, a conductive portion 33 made of a conductive material is provided at a region on the bottom surface of the supporting plate 30 which comes into contact with the pressing target portion 515, and a conductive portion 24 made of a conductive material is provided at a region on the top surface of the rotary plate 20 which comes into contact with the conductive portion 33. Accordingly, if the conductive portion 24 is grounded, a grounding circuit for neutralizing electric charges of the wafer W held by the movable member 51 in an electrically charged state can be constructed. In this way, the movable member 51 using the conductive member may have a function of neutralizing the electric charges of the wafer W. Particularly, in a rinsing processing for the wafer W using pure water or the like, the charge neutralization of the wafer W is required.

Meanwhile, when wet etching is performed by using the above-described substrate processing apparatus 10 as the liquid processing upon the wafer W having a conductive film, there may occur a phenomenon that etching is accelerated more in the vicinity of a region where the movable member 51 and the conductive film of the wafer W come into contact with each other, as compared to other regions.

As an example of the wafer W which experiences this acceleration of the liquid processing in the vicinity of the movable member 51, a wafer W having a conductive film such as titanium nitride (TiN), tungsten (W) or cobalt (Co) formed on a mother board made of, for example silicon may be used. If the liquid processing (etching processing) is performed in the state that the conductive film of the wafer W and the movable member 51 are in contact with each other, there is formed a singularity where the etching is accelerated more than in other regions, as investigated by the present inventors. To elaborate, the singularity where the etching is accelerated is found in the vicinity of a region (near a region R1 in FIG. 4) held by the movable member 51. Further, though SPM (Sulfuric acid Peroxide Mixture) is used as an etching liquid, the etching may be accelerated regardless of the kind of the etching liquid.

The present inventors have investigated the reason why the singularity of the etching is formed near the movable member 51 and found out the following. That is, in an oxidation-reduction reaction between the conductive film and the processing liquid for processing the conductive film, electrons released from the conductive film pass through the movable member 51, so that an electric circuit is formed via the movable member 51 and the conductive film of the wafer W is formed. As the electrons move through this electric circuit, the release of the electrons from the conductive film is accelerated, so that separation of ions in a material forming the conductive film, that is, etching of the conducive film by the processing liquid is accelerated.

Through a research of the present inventors, it is also found out that the above-described acceleration of the etching of the conductive film may take place even in case that the movable member 51 is not in direct contact with the conductive film. For example, if the conductive film on the peripheral portion of the wafer W is removed, the movable member 51 comes into contact with the mother board of the wafer W to be not in direct contact with the conductive film. If the aforementioned electric circuit is formed only via the movable member 51 and the conductive film of the wafer W, no electric circuit may be formed in the case that the movable member 51 is not in direct contact with the conductive film of the wafer W. Actually, however, the present inventors have found out that the acceleration of the etching still occurs in the vicinity of the moving member 51 even in case that the movable member 51 is not in direct contact with the conductive film of the wafer W as stated above. That is, it is found out that there is a likelihood that an electric circuit may be formed via the processing liquid (processing liquid flowing in the vicinity of the wafer W and the movable member 51) and the mother board of the wafer W as well as the conductive film of the wafer W and the movable member 51.

As stated above, it is deemed that if the electric circuit passing through the movable member 51 and the conductive film at least is formed in the vicinity of the movable member 51, the etching in the vicinity of the movable member 51 is accelerated. In view of this, by hampering the formation of the electric circuit, the acceleration of the etching can be suppressed. That is, by building up a configuration in which the electric circuit passing through the movable member 51 is not formed, the acceleration of the etching upon the conductive film in the vicinity of the movable member 51 can be suppressed. To suppress the formation of the electric circuit passing through the movable member 51, building up a configuration in which electricity does not flow to the movable member 51 itself, that is, a configuration in which electricity does not flow between the movable member 51 and the wafer W or it is difficult for the electricity to flow between the movable member 51 and the wafer W may be considered. To elaborate, a resistance value (electric resistance) of the movable member 51 may be set to be large, or the movable member 51 may be made of an insulating material. If, however, the configuration in which electricity does not flow between the movable member 51 and the wafer W is provided, the charge neutralization of the wafer W by the movable member 51 may not be carried out, and an electrostatic breakdown due to the charging of the wafer W or the like may be caused. To be specific, to suppress the formation of the electric circuit passing through the movable member 51 and the wafer W, it is desirable that the resistance value of the movable member 51 is equal to or larger than, e.g., $10^{15} \Omega$. Meanwhile, to carry out the charge neutralization of the wafer W by using the movable member 51, it is desirable that the resistance value of the movable member 51 is equal to or less than, e.g., $10^5 \Omega$.

In view of this, the substrate processing apparatus 10 according to the present exemplary embodiment is configured such that the formation of the electric circuit passing through the movable member 51 can be suppressed when performing the etching of the wafer W by the processing liquid and the charge neutralization of the wafer W can also be carried out. For the purpose, the movable member 51 is configured to be capable of varying the resistance value (electric resistance) thereof. When performing the etching of the wafer W by the processing liquid, the formation of the electric circuit passing through the movable member 51 and the wafer W can be suppressed by increasing the resistance value of the movable member 51. In other times (for example, when performing the rinsing processing) except when the etching of the wafer W by the processing liquid is performed, the charge neutralization of the wafer W is accelerated by setting the resistance value of the movable member 51 to be small. By adopting this configuration, when performing the etching of the wafer W, the acceleration of the etching of the wafer W in the vicinity of the movable member 51 can be suppressed.

As a specific configuration of the movable member 51 having the above-described functions, the following three configuration examples will be explained.

<First Configuration Example>

Figure 5A:
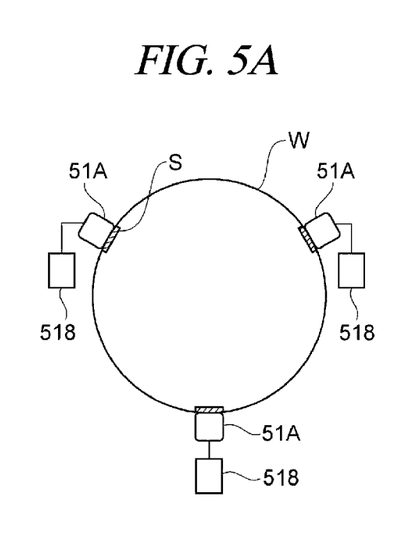
FIG. 5A to FIG. 5C are diagrams illustrating a configuration example of the movable members in the substrate processing apparatus according to the exemplary embodiment.
Figure 5B:
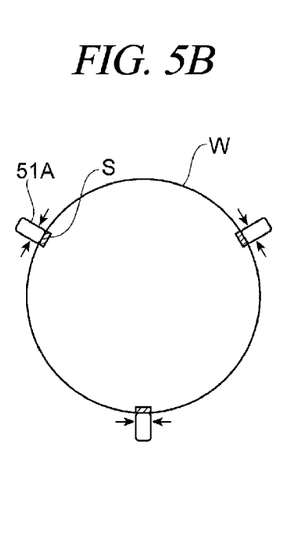
Figure 5C:
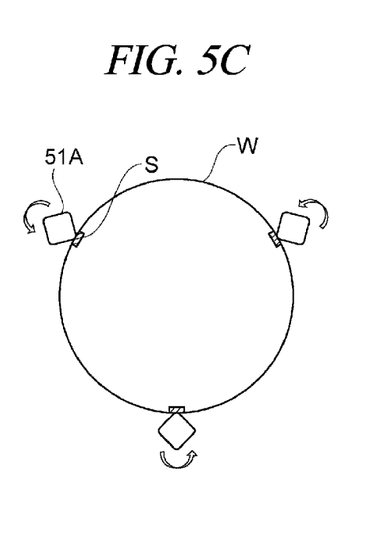

First, a configuration of varying a resistance value against an electric current flowing between the wafer W and the movable member by varying a contact area between the movable member and the wafer W will be explained as a first configuration example. As illustrated in FIG. 5A, assume that a movable member 51A is capable of varying a contact area S with respect to the wafer W in the first configuration example. As depicted in FIG. 5A, in case that a plurality of (for example, three) movable members 51A is provided, multiple resistance value varying mechanisms 518 respectively corresponding to the movable members 51A are provided to individually vary the contact areas between the wafer W and the movable members 51A. Further, the resistance value varying mechanisms 518 may be configured to vary the resistance values of the movable members 51A all at once. In FIG. 5B and FIG. 5C, illustration of the resistance value varying mechanisms 518 is omitted.

As a way to vary the contact area S between the movable member 51A and the wafer W, a method of changing a shape of the movable member 51A, a method of changing a contact position between the movable member 51A and the wafer W, or the like may be used.

FIG. 5B illustrates a specific example of the method of changing the shape of the movable member 51A. If it is possible to vary a width (a length along the circumferential direction) of a leading end of the movable member 51A (corresponding to the leading end of the upright portion 511 in FIG. 5, etc.) when viewed from the top, the contact area S can be varied by varying the width. FIG. 5B shows a state in which the contact area S is reduced by narrowing the width of the movable member 51A, as compared to a state shown in FIG. 5A. For example, to achieve the movable member 51A capable of varying the width of the leading end thereof, the leading end of the movable member 51A may be made of a material having elasticity and there may be adopted a configuration in which the width of the leading end of the movable member 51A is changed by changing a pressing force by the resistance value varying mechanism 518, for example. Further, there may be adopted a configuration in which the contact area S is changed by changing a thickness of the leading end of the movable member 51A, instead of changing the width thereof.

As shown in FIG. 5B, by adopting the configuration of varying the contact area S by changing the shape of the leading end of the movable member 51A, the resistance value against the electric current flowing between the wafer W and the movable member can be changed by the resistance value varying mechanism 518.

FIG. 5C illustrates a specific example of the method of changing the contact position between the movable member 51A and the wafer W. In the example shown in FIG. 5C, the leading end of the movable member 51A (corresponding to the leading end 512 of the upright portion 511 in FIG. 1, etc.) has a rectangular shape when viewed from the top. By rotating the movable member 51A, the contact position with respect to the wafer W is changed from a specific one side of the rectangle shown in FIG. 5A to a leading end corner of the rectangle, so that a contact surface between the movable member 51A and the wafer W is changed. That is, the movable member 51A has multiple contact surfaces for the wafer W, and the contact area S is changed by selecting one of these contact surfaces. The resistance value varying mechanism 518 has a function of varying the contact position of the movable member 51 with respect to the wafer W by rotating the leading end of the movable member 51A. In this way, by changing the contact surface through the rotation of the movable member 51A, the contact area S may be set to be small. In the example shown in FIG. 5C, though the leading end of the movable member 51A is rotated so that the contact area S is changed when viewed from the top, the rotational direction may be appropriately changed. Further, by varying the shape of the movable member 51A, the degree of the variation of the contact area S or the like may be adjusted.

In both of the method of changing the shape of the movable member 51A and the method of changing the contact position between the movable member 51A and the wafer W, the resistance value can be changed without changing the number of the movable members. Both of the method of changing the shape of the movable member 51A and the method of changing the contact position between the movable member 51A and the wafer W are not particularly limited as long as the contact area S between the movable member 51A and the wafer W can be varied. That is, the changing the contact area W viewed from the top, as illustrated in FIG. 5A to FIG. 5C, is not essential. Furthermore, as long as at least the contact area S between the movable member 51A and the wafer W can be changed, all of the movable members 51A need not be transformed or rotated.

<Second Configuration Example>

A configuration of varying the resistance value against the electric current flowing between the wafer W and the movable member by using a combination of two kinds of movable members having different resistance values will be explained as a second configuration example.

The second configuration example will be described for a case where two kinds of movable members (a movable member 51B (first holder) and a movable member 51C (second holder)) having different resistance values are used. By way of example, the movable members 51B and 51C may have the same shape, but be made of different materials so that they have different resistance values. To elaborate, the movable member 51B may be made of PEEK (Poly Ether Ether Ketone, registered trademark) or PFA (Perfluoroalkoxyalkane) which have been conventionally used as the movable member. These materials have a relatively low (small) resistance value. Further, the movable member 51C may be made of such a material as PCTFE (Polychlorotrifluoroethylene) having a high (large) resistance value. The entire movable member 51B (51C) need not be made of the aforementioned materials, and only a part of a leading end of the movable member 51B (51C) (the leading end 512 of the upright portion 511) needs to be made of the aforementioned materials. Furthermore, in case of forming the movable member by injection molding, the movable members 51B and 51C may be made of the same material, and there may be adopted a method of varying the resistance value by forming a portion of the movable member 51C to be brought into contact with the wafer W with a skin layer in contact with a mold. That is, the method of varying the resistance value through the movable member is not particularly limited.

Furthermore, as stated above, it is deemed that the etching of the wafer W is accelerated as the electric circuit passing through the contact surface between the wafer W and the movable member is formed. Thus, at least the leading end of the movable member (the leading end 512 of the upright portion 511) needs to be made of the preset material within a range where a required resistance value can be obtained.

Figure 6A:
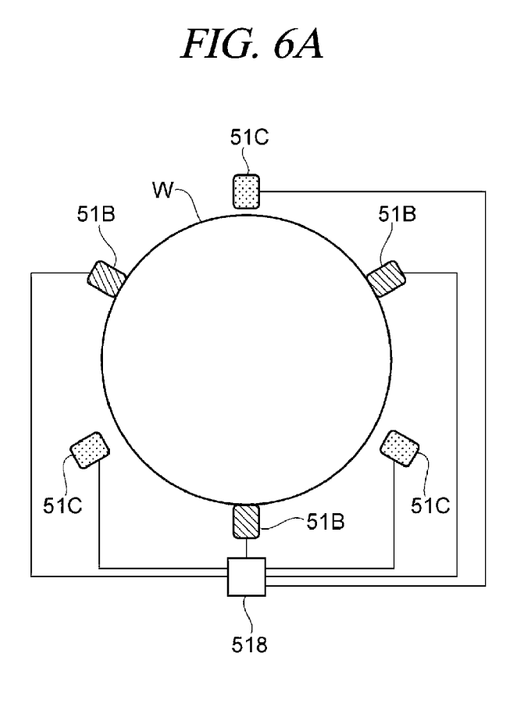
FIG. 6A and FIG. 6B are diagrams illustrating a configuration example of the movable members in the substrate processing apparatus according to the exemplary embodiment.

Three movable members 51B and three movable members 51C are alternately arranged at an angular distance of 60°, as illustrated in FIG. 6A. In this configuration, the movable members 51B (51C) are equi-spaced at an angular distance of 120°. Further, the restriction members 52 (see FIG. 2) are appropriately arranged to correspond to the movable members 51B and 51C, respectively.

All of the movable members 51B and 51C are connected to the resistance value varying mechanism 518, and a contact and a non-contact between the movable member and the wafer W can be switched through an operation of the resistance value varying mechanism 518.

Figure 6B:
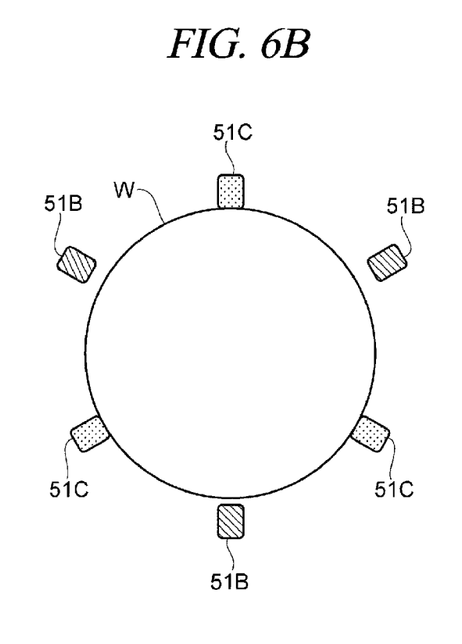

In such a configuration, in case that only the movable members 51B are in contact with the wafer W as depicted in FIG. 6A, the resistance value of the movable members 51B is relatively low, so that electrical conduction between the wafer W and the movable members 51B easily occurs. Therefore, the charge neutralization of the wafer W can be appropriately carried out. Meanwhile, in case that only the movable members 51C are in contact with the wafer W as shown in FIG. 6B, the resistance value of the movable members 51C is relatively high, so that the electrical conduction between the wafer W and the movable members 51C may not occur.

Thus, when performing the etching of the wafer W, by operating the resistance value varying mechanism 518 to hold the wafer W with the movable members 51C, no electric current is allowed to flow between the wafer W and the movable members 51C. On the other hand, when the etching is not performed, by operating the resistance value varying mechanism 518 to hold the wafer W with the movable members 51B, the electrical conduction between the wafer W and the movable member 51B is accelerated, and the charge neutralization is performed. In this way, the resistance value of the movable members can be changed by switching the movable members 51B and 51C to hold the wafer W.

Furthermore, the resistance value varying mechanism 518 performs a switchover between a state where the resistance value of the movable members in contact with the wafer W is high and a state where the resistance value of the movable members in contact with the wafer W is low by switching the movable members 51B and 51C. In FIG. 6A and FIG. 6B, the resistance value varying mechanism 518 changes the resistance value by changing the kind of the movable members in contact with the wafer W, that is, by switching the movable members 51B and the movable members 51C completely. However, as long as the resistance value varying mechanism 518 is capable of performing the switchover between the state where the resistance value of the movable members in contact with the wafer W is high and the state where the resistance value of the movable members in contact with the wafer W is low, the way to combine the movable members in contact with the wafer W to realize the above-stated two states is not particularly limited.

For example, by holding the wafer W with all of the movable members 51B and 51C (by combining the movable members 51B of FIG. 6A and the movable members 51C of FIG. 6B), the state where the resistance value of the movable members in contact with the wafer W is low can be achieved. Moreover, the two states may be switched by using three or more kinds of movable members having different resistance values. Further, only one kind of movable members may be used, and, in such a case, the two states may be switched by changing the number of the movable members which hold the wafer W. In these configurations in which the kind (or the number) of the movable members which hold the wafer W is changed to vary the resistance value of the movable members in contact with the wafer W, the resistance value can be changed simply by moving the movable members. Therefore, the variation of the resistance value can be carried out through a simple mechanism.

<Third Configuration Example>

As a third configuration example, the movable member 51 itself may have a variable resistance value. In general, a conventionally used material of the movable member 51 may have a constant resistance value. By using a material having a variable resistance value for the movable member 51, however, the resistance value against the electric current flowing between the wafer W and the movable member can be varied.

To elaborate, the resistance value can be changed by using, as the movable member 51, a material having conductivity which is changed by a force applied thereto, that is, a pressure-sensitive conductive material. By way of example, pressure-sensitive elastomer (pressure-sensitive rubber) may be used as the pressure-sensitive conductive material.

The movable member 51 is rotated by being pressed by the supporting plate 30, and comes into contact with the wafer W to support the wafer W. At this time, if there is adopted a configuration in which the resistance value of the movable member 51 is raised by increasing a force applied from the wafer W, the resistance value of the movable member 51 can be changed depending on a processing involved. To be specific, while the etching processing upon the wafer W is being performed, the resistance value may be set to be large by increasing the force applied to the movable member 51. Meanwhile, when the etching processing upon the wafer W is not performed, the force applied to the movable member 51 may be set to be small, thus setting the resistance value to be small. In carrying out this configuration, the supporting plate 30 configured to cause the rotation of the movable member 51, the spring member 514 configured to support the movable member 51, or the like may be used as the resistance value varying mechanism 518. That is, the conductivity may be changed by controlling the rotational direction of the movable member 51 through the supporting plate 30 and enhancing the force for holding the wafer W by the movable member 51. Furthermore, an additional member may be provided as the resistance value varying mechanism 518 configured to vary the force applied to the movable member 51. For example, a mechanism for varying a force by which the wafer W is pushed by the movable member 51 may be provided at the outside of the movable member 51 (for example, near the inner cup 41). Furthermore, the configuration of varying the force applied to the movable member 51 is not limited to varying the force by which the wafer W is pushed by the movable member 51 as long as the force applied to the movable member 51 is variable. By way of non-limiting example, the force applied to the movable member 51 may be varied by using air, a wind pressure, or the like.

Moreover, the resistance value can be varied by using a material whose conductivity is varied by an ambient temperature thereof, that is, a temperature-sensitive conductive material as the movable member 51. Such a material may be, by way of example, PCT thermistor, but not limited thereto. A temperature of the processing liquid when performing the etching processing is generally equal to or higher than 40 degrees, whereas the temperature of the processing liquid when performing other processings is generally lower than 40 degrees. Accordingly, in consideration of this temperature variation, a material having a resistance value which is increased at a high temperature (e.g., equal to or higher than 40 degrees) is used as the movable member 51. Therefore, while the etching processing upon the wafer W is being performed, the resistance value can be increased as the temperature of the movable member is increased. Meanwhile, when the etching processing upon the wafer W is not performed, the resistance value can be reduced as the temperature of the movable member 51 is decreased. Furthermore, in case of using, as the movable member 51, the material having the resistance value which is changed by the temperature, components which vary the ambient temperature around the movable member 51, that is, the top-surface nozzle 74 configured to supply the processing liquid and the controller 18 configured to control the supply of the processing liquid may serve as the resistance value varying mechanism 518.

In the third configuration example where the movable member 51 itself has the variable resistance value, the variation of the resistance value can be carried out without changing the number of the movable members. Furthermore, in case of using the PCT thermistor as the movable member 51, the resistance value is varied by changing the temperature of the processing liquid. Thus, without needing to use a new operational mechanism configured to control the movement of the movable member or the like, the movable member capable of varying the resistance value thereof can be realized.

So far, the various exemplary embodiments have been described. However, the above-described exemplary embodiments are not limiting, and some of the components may be omitted, replaced or modified. Furthermore, another exemplary embodiment may be created by combining elements in the various exemplary embodiments.

For example, in the above-described exemplary embodiment, the movable members 51 and the restriction members 52 configured to hold the wafer W rotated on the rotary plate 20 and the supporting plate 30 are configured as the holder configured to hold the wafer W. However, the holder configured to hold the wafer W in the etching processing may not be a member different from the movable members 51 and the restriction members 52. By way of example, the holder may not be the mechanical chuck configured to hold the side peripheral surface of the wafer W but may be a so-called spin chuck configure to rotate the wafer W by holding the rear surface thereof.

Moreover, in the above-described exemplary embodiment, the three configuration examples have been described. However, these three configuration examples may be combined in various ways.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

EXAMPLES

Example 1

A substrate processing apparatus comprises a holder configured to hold a substrate; a processing liquid supply configured to supply a processing liquid onto the substrate held by the holder; and a resistance value varying mechanism configured to vary an electrical resistance of the holder in contact with the substrate. As stated above, by adopting the configuration where the electrical resistance of the holder is variable, the electrical resistance of the holder can be changed depending on a stage of the liquid processing with the processing liquid, for example. Thus, by setting the electrical resistance of the holder to be low, for example, the electric current is suppressed from flowing between the holder and the substrate, so that the corrosion of the substrate or the like can be suppressed. Therefore, the etching on the surface of the substrate can be carried out appropriately.

Example 2

In the substrate processing apparatus of Example 1, the holder comprises a first holder having a low electrical resistance and a second holder having a high electrical resistance, and the resistance value varying mechanism varies the electrical resistance of the holder in contact with the substrate by switching the holder which holds the substrate between the first holder and the second holder. In this case, by switching the holder between the first holder and the second holder, the electrical resistance of the holder in contact with the substrate can be changed. Therefore, the variation of the electrical resistance can be carried out through a simple mechanism.

Example 3

In the substrate processing apparatus of Example 1, the holder comprises multiple holding surfaces having different contact areas with respect to the substrate, and the resistance value varying mechanism varies the electrical resistance of the holder in contact with the substrate by varying the contact areas between the holder and the substrate. In this case, by changing the holding surfaces, the contact area between the substrate and the holder is changed, so that the electrical resistance of the holder in contact with the substrate can be changed. Therefore, the variation of the electrical resistance can be carried out without increasing the number of the holder.

Example 4

In the substrate processing apparatus of Example 1, the holder number includes multiple holders, and the resistance value varying mechanism varies the electrical resistance of the holder in contact with the substrate by changing a number of the multiple holders which come into contact with the substrate. By varying the number of the multiple holders configured to hold the substrate, the electrical resistance of the holder in contact with the substrate can be changed. Therefore, the variation of the electrical resistance can be carried out through a simple mechanism.

Example 5

In the substrate processing apparatus of Example 1, the holder is made of a pressure-sensitive conductive material, and the resistance value varying mechanism varies the electrical resistance of the holder in contact with the substrate by varying a force applied to the holder from the substrate. In this case, by changing the force applied to the substrate through the resistance value varying mechanism, the electrical resistance of the holder in contact with the substrate can be changed. Therefore, the variation of the electrical resistance can be carried out without needing to perform the switchover of the holder.

Example 6

In the substrate processing apparatus of Example 1, the holder is made of a PCT thermistor, and the resistance value varying mechanism varies the electrical resistance of the holder in contact with the substrate by varying a temperature of the processing liquid flowing near the holder. In this case, the contact area of the holder is changed by changing the temperature of the holder, and the electrical resistance of the holder in contact with the substrate can be changed. Therefore, the variation of the electrical resistance can be carried out without needing to alter the holder to hold the substrate.

Example 7

A substrate processing method of performing a processing onto a substrate held by a holder by supplying a processing liquid to the substrate, the substrate processing method comprises varying an electrical resistance of the holder in contact with the substrate during the processing. In this case, the same effect as Example 1 is achieved.

Example 8

In the substrate processing method of Example 7, the electrical resistance of the holder in contact with the substrate is set to be large when an etching processing is performed. When performing the etching processing, the corrosion of the substrate may occur as the electric current flows between the substrate and the holder. According to the present example, however, the corrosion of the substrate can be suppressed, so that the etching on the surface of the substrate can be carried out appropriately.

Example 9

In the substrate processing method of Example 7 or 8, the electrical resistance of the holder in contact with the substrate is set to be small when a rinsing processing is performed. When performing the rinsing processing, the holder needs to be electrically connected to the substrate to perform the charge neutralization. Thus, according to the present example, the charge neutralization can be carried out appropriately, so that the damage on the substrate can be suppressed.

According to the exemplary embodiment, it is possible to perform the etching processing on the surface of the substrate appropriately.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a holder configured to hold a substrate;
   a processing liquid supply configured to supply a processing liquid onto the substrate held by the holder; and
   a resistance value varying mechanism configured to vary an electrical resistance of the holder in contact with the substrate,
   wherein the holder comprises a first holder having a low electrical resistance and a second holder having a high electrical resistance, and
   the resistance value varying mechanism varies the electrical resistance of the holder in contact with the substrate by switching the holder, which holds the substrate, between the first holder and the second holder.

2. The substrate processing apparatus of claim 1,
   wherein the holder is made of a pressure-sensitive conductive material, and
   the resistance value varying mechanism varies the electrical resistance of the holder in contact with the substrate by varying a force applied to the holder from the substrate.

3. The substrate processing apparatus of claim 1,
wherein the holder is made of a PTC (positive temperature coefficient) thermistor, and
the resistance value varying mechanism varies the electrical resistance of the holder in contact with the substrate by varying a temperature of the processing liquid flowing near the holder.

4. A substrate processing apparatus, comprising:
a holder configured to hold a substrate;
a processing liquid supply configured to supply a processing liquid onto the substrate held by the holder; and
a resistance value varying mechanism configured to vary an electrical resistance of the holder in contact with the substrate,
wherein the holder comprises multiple holding surfaces having different contact areas with respect to the substrate, and
the resistance value varying mechanism varies the electrical resistance of the holder in contact with the substrate by varying the contact areas between the holder and the substrate.

5. The substrate processing apparatus of claim 4,
wherein the holder is made of a pressure-sensitive conductive material, and
the resistance value varying mechanism varies the electrical resistance of the holder in contact with the substrate by varying a force applied to the holder from the substrate.

6. The substrate processing apparatus of claim 4,
wherein the holder is made of a PTC (positive temperature coefficient) thermistor, and
the resistance value varying mechanism varies the electrical resistance of the holder in contact with the substrate by varying a temperature of the processing liquid flowing near the holder.

7. A substrate processing apparatus, comprising:
a holder configured to hold a substrate;
a processing liquid supply configured to supply a processing liquid onto the substrate held by the holder; and
a resistance value varying mechanism configured to vary an electrical resistance of the holder in contact with the substrate,
wherein the holder includes multiple holders, and
the resistance value varying mechanism varies the electrical resistance of the holder in contact with the substrate by changing a number of the multiple holders which come into contact with the substrate.

8. The substrate processing apparatus of claim 7,
wherein the holder is made of a pressure-sensitive conductive material, and
the resistance value varying mechanism varies the electrical resistance of the holder in contact with the substrate by varying a force applied to the holder from the substrate.

9. The substrate processing apparatus of claim 7,
wherein the holder is made of a PTC (positive temperature coefficient) thermistor, and
the resistance value varying mechanism varies the electrical resistance of the holder in contact with the substrate by varying a temperature of the processing liquid flowing near the holder.

10. A substrate processing method comprising:
supplying a processing liquid to a substrate held by a holder comprising a first holder having a low electrical resistance and a second holder having a high electrical resistance; and
varying an electrical resistance of the holder in contact with the substrate via a resistance value varying mechanism by switching the holder, which holds the substrate, between the first holder and the second holder.

11. The substrate processing method of claim 10,
wherein the electrical resistance of the holder in contact with the substrate is set to be large when an etching processing is performed.

12. The substrate processing method of claim 11,
wherein the electrical resistance of the holder in contact with the substrate is set to be small when a rinsing processing is performed.

13. The substrate processing method of claim 10,
wherein the electrical resistance of the holder in contact with the substrate is set to be small when a rinsing processing is performed.

* * * * *